(12) United States Patent
Hayakawa et al.

(10) Patent No.: US 11,789,147 B2
(45) Date of Patent: Oct. 17, 2023

(54) SEMICONDUCTOR OPTICAL AMPLIFIER, OPTICAL OUTPUT DEVICE, AND DISTANCE MEASURING DEVICE

(71) Applicants: FUJIFILM BUSINESS INNOVATION CORP., Tokyo (JP); TOKYO INSTITUTE OF TECHNOLOGY, Tokyo (JP)

(72) Inventors: Junichiro Hayakawa, Ebina (JP); Daiki Tominaga, Ebina (JP); Akemi Murakami, Ebina (JP); Fumio Koyama, Tokyo (JP)

(73) Assignees: FUJIFILM BUSINESS INNOVATION CORP., Tokyo (JP); TOKYO INSTITUTE OF TECHNOLOGY, Tokyo (JP)

( * ) Notice: Subject to any disclaimer, the term of this patent is extended or adjusted under 35 U.S.C. 154(b) by 525 days.

(21) Appl. No.: 16/834,522

(22) Filed: Mar. 30, 2020

(65) Prior Publication Data
US 2020/0335939 A1 Oct. 22, 2020

(30) Foreign Application Priority Data
Apr. 16, 2019 (JP) .................................. 2019-077574

(51) Int. Cl.
*H01S 5/50* (2006.01)
*G01S 17/08* (2006.01)
(Continued)

(52) U.S. Cl.
CPC .......... *G01S 17/08* (2013.01); *B23K 26/0648* (2013.01); *G01S 7/4814* (2013.01);
(Continued)

(58) Field of Classification Search
CPC ... G01S 17/08; G01S 7/4814; B23K 26/0648; H01S 5/3432; H01S 5/34353; H01S 5/50;
(Continued)

(56) References Cited

U.S. PATENT DOCUMENTS 5,003,550 A * 3/1991 Welch .................... H01S 5/50
372/45.01
5,392,308 A 2/1995 Welch et al.
(Continued)

FOREIGN PATENT DOCUMENTS

JP 2017-157609 A 9/2017
JP 2018-032793 A 3/2018

OTHER PUBLICATIONS

M. Nakahama et al., "Slow light VCSEL amplifier for high-resolution beam steering and high-power operations." 2016 Conference on Lasers and Electro-Optics (CLEO) (2016): 1-2. (Year: 2016).*
(Continued)

*Primary Examiner* — Xinning(Tom) Niu
(74) *Attorney, Agent, or Firm* — Oliff PLC

(57) ABSTRACT

A semiconductor optical amplifier includes: a substrate; a light source unit formed on the substrate; and an optical amplification part that amplifies light propagating in a predetermined direction from the light source unit and emits the amplified light in an emission direction intersecting with the substrate surface. The optical amplification part includes a conductive region extending in the predetermined direction along the substrate surface from the light source unit, and a nonconductive region formed around the conductive region. The conductive region includes a first region extending from the light source unit and having a predetermined width as seen from a direction perpendicular to the substrate surface, and a second region connected to the first region and having a width widened relative to the predetermined width
(Continued)

of the first region, the second region being configured to expand the propagation light in a direction intersecting with the predetermined direction.

13 Claims, 7 Drawing Sheets

(51) Int. Cl.
    *G01S 7/481*     (2006.01)
    *H01S 5/343*     (2006.01)
    *B23K 26/06*     (2014.01)

(52) U.S. Cl.
    CPC ........ *H01S 5/3432* (2013.01); *H01S 5/34353* (2013.01); *H01S 5/50* (2013.01)

(58) Field of Classification Search
    CPC .. H01S 5/04254; H01S 5/1064; H01S 5/1014; H01S 5/1082; H01S 5/168; H01S 5/183; H01S 5/125
    See application file for complete search history.

(56) References Cited

U.S. PATENT DOCUMENTS

| | | | |
|---|---|---|---|
| 6,525,872 B1 * | 2/2003 | Ziari | H01S 5/1064 |
| | | | 359/341.1 |
| 9,166,369 B2 * | 10/2015 | Kanskar | H01S 5/0287 |
| 10,811,844 B2 * | 10/2020 | Chae | H01S 5/141 |
| 2002/0186736 A1 * | 12/2002 | Takahashi | H01L 21/0262 |
| | | | 372/50.1 |
| 2004/0218655 A1 * | 11/2004 | Tandon | H01S 5/3095 |
| | | | 372/96 |
| 2018/0059586 A1 | 3/2018 | Kondo et al. | |
| 2020/0059070 A1 * | 2/2020 | Hayakawa | H01S 5/125 |

OTHER PUBLICATIONS

Oct. 25, 2022 Office Action issued in Japanese Patent Application No. 2019-077574.

Feb. 21, 2023 Office Action issued in Japanese Patent Application No. 2019-077574.

* cited by examiner

SEMICONDUCTOR OPTICAL AMPLIFIER, OPTICAL OUTPUT DEVICE, AND DISTANCE MEASURING DEVICE

CROSS-REFERENCE TO RELATED APPLICATIONS

This application is based on and claims priority under 35 USC 119 from Japanese Patent Application No. 2019-077574 filed on Apr. 16, 2019.

BACKGROUND

Technical Field

The present invention relates to a semiconductor optical amplifier, an optical output device, and a distance measuring device, and particularly to a semiconductor optical amplifier using a waveguide using a distributed Bragg reflector, and an optical output device and a distance measuring device using the semiconductor optical amplifier.

Related Art

JP-A-2018-032793 discloses a light emitting element array which is related to a semiconductor optical amplifier using a distributed Bragg reflector waveguide and includes plural semiconductor laminated structures each of which includes a light emitting unit formed on a substrate, and an optical amplification part configured to extend along a substrate surface of the substrate from the light emitting unit, and have a length in the extension direction longer than that of the light emitting unit, and amplify light propagating in the extension direction from the light emitting unit, and emit the amplified light from a light emission part formed along the extension direction, wherein the plural semiconductor laminated structures is arranged such that the extension directions of the optical amplification parts become almost parallel with each other.

SUMMARY

Aspect of non-limiting embodiments of the present disclosure relates to a semiconductor optical amplifier which is a semiconductor optical amplifier using a distributed Bragg reflector waveguide and whose optical output in a predetermined direction is larger as compared to the case where the width of a conductive region is uniform, an optical output device, and a distance measuring device.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a semiconductor optical amplifier including: a substrate having a substrate surface; a light source unit that is formed on the substrate; and an optical amplification part that amplifies light propagating in a predetermined direction from the light source unit and emits the amplified light in an emission direction intersecting with the substrate surface, the optical amplification part including a conductive region formed to extend in the predetermined direction along the substrate surface from the light source unit, and a nonconductive region formed around the conductive region, wherein the conductive region includes a first region extending from the light source unit and having a predetermined width as seen from a direction perpendicular to the substrate surface, and a second region connected to the first region and having a width widened relative to the predetermined width of the first region, the second region being configured to expand the propagation light in a direction intersecting with the predetermined direction.

BRIEF DESCRIPTION OF DRAWINGS

Exemplary embodiment(s) of the present invention will be described in detail based on the following figures, wherein.

DETAILED DESCRIPTION

Hereinafter, exemplary embodiments of the present invention will be described in detail with reference to the drawings.

First Exemplary Embodiment

Figure 1A:
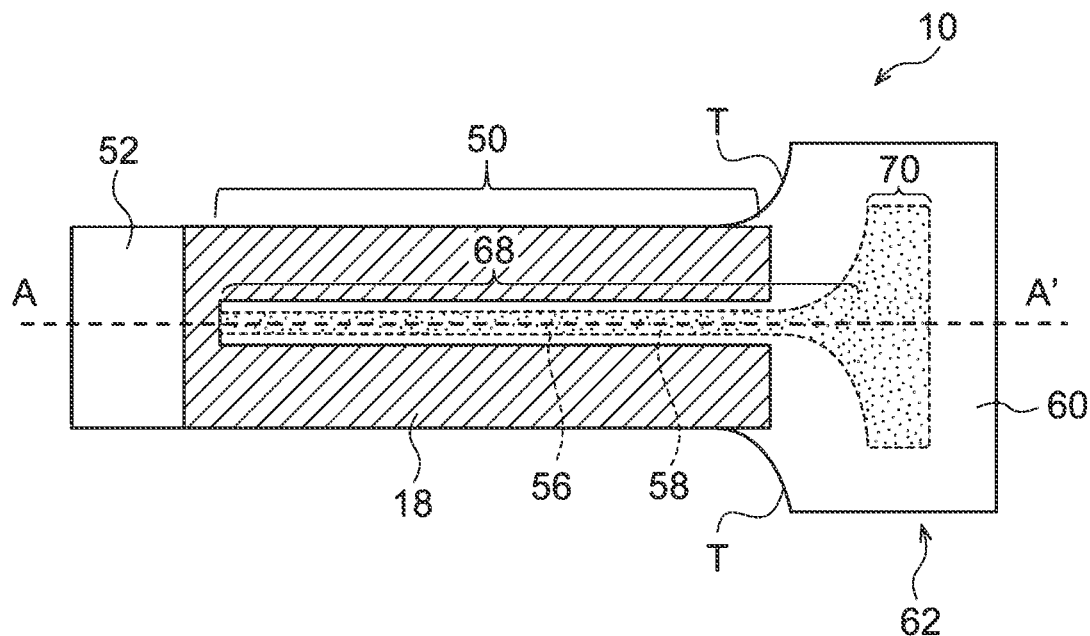
FIG. 1A is a plan view illustrating an example of the configuration of a semiconductor optical amplifier according to a first exemplary embodiment.

With reference to FIG. 1A to FIG. 4B, a semiconductor optical amplifier 10 according to a first exemplary embodiment will be described. FIG. 1A is a plan view of the semiconductor optical amplifier 10, and FIG. 1B is a cross-sectional view taken along a line A-A' shown in FIG. 1A. As shown in FIG. 1A, the semiconductor optical amplifier (SOA) 10 includes an optical amplification part 50, a wide part 62, and an optical coupler 52.

The optical amplification part 50 has a function of amplifying light (seed light) coupled to the optical coupler 52 and emitting the amplified light. The optical coupler 52 is an example of a "light source unit" according to the present exemplary embodiment. The optical amplification part 50 according to the present exemplary embodiment is configured, for example, as a surface-emitting type optical amplification part using a GaAs-based distributed Bragg reflector waveguide (hereinafter, referred to as DBR waveguide). In other words, the optical amplification part 50 is configured to include an N electrode 40 formed on a rear surface of a substrate 30, and a lower DBR 32, an active region 34, an upper DBR 36, a nonconductive region 60, a conductive region 58, and a P electrode 18 formed on the substrate 30.

In the present exemplary embodiment, the substrate 30 is a n-type GaAs substrate, and the N electrode 40 is provided on the rear surface of the substrate 30. Meanwhile, the lower DBR 32 according to the present exemplary embodiment is of n-type, and the upper DBR 36 is of p-type. In order to drive the semiconductor optical amplifier 10, the positive electrode and negative electrode of a power supply for driving are connected to the P electrode 18 and the N electrode 40, respectively, whereby a driving current flows from the P electrode 18 to the N electrode 40. However, the polarities of the substrate 30, the lower DBR 32, and the upper DBR 36 are not limited thereto. The polarities of them may be reversed. In other words, the substrate 30 may be a p-type GaAs substrate, and the lower DBR 32 may be of p-type, and the upper DBR 36 may be of n-type.

The lower DBR 32 pairs up with the upper DBR 36 to be described below and constitutes a resonator which contributes to light emission of the semiconductor optical amplifier 10. The lower DBR 32 is a multi-layer reflector which is configured by alternately and repeatedly stacking two kinds of semiconductor layers each of which has a film thickness of $0.25\lambda/n$ and which are different in their refraction indexes such that the oscillation wavelength of the semiconductor optical amplifier 10 becomes $\lambda$ and the refraction index of the media (semiconductor layers) becomes n. As a specific example, the lower DBR 32 is configured by alternately and repeatedly stacking n-type low-refractive-index layers using $Al_{0.90}Ga_{0.1}As$ and n-type high-refractive-index layers using $Al_{0.2}Ga_{0.8}As$.

The active region 34 according to the present exemplary embodiment may be configured, for example, to include a lower spacer layer, a quantum-well active region, and an upper spacer layer (not shown in the drawings). The quantum-well active region according to the present exemplary embodiment may be composed of, for example, a barrier layer composed of four $Al_{0.3}Ga_{0.7}As$ layers and three GaAs layers provided between them. By the way, the lower spacer layer and the upper spacer layer are disposed between the quantum-well active region and the lower DBR 32 and between the quantum-well active region and the upper DBR 36, respectively, so as to have a function of adjusting the length of the resonator and a function of serving as a clad layer for confining carriers.

The nonconductive region 60 and the conductive region 58 provided on the active region 34 are p-type oxidation constriction layers, i.e. current constriction layers. In other words, the nonconductive region 60 corresponds to an oxidized region, and the conductive region 58 corresponds to a non-oxidized region. In the present exemplary embodiment, a region of one layer of the multiple layers constituting the upper DBR 36 is oxidized, whereby the nonconductive region 60 (the oxidized region) is formed, and the other region of the corresponding layer except the nonconductive region 60 constitutes the non-oxidized conductive region 58 (the non-oxidized region). Current which flows from the P electrode 18 to the N electrode 40 is constricted by the conductive region 58. In the present exemplary embodiment, the form in which the nonconductive region 60 (the oxidized region) is formed in one layer of the upper DBR 36 is described as an example. However, the nonconductive region is not limited thereto, and may be formed in plural layers of the upper DBR 36, or may be formed in the lower DBR 32.

Figure 1B:
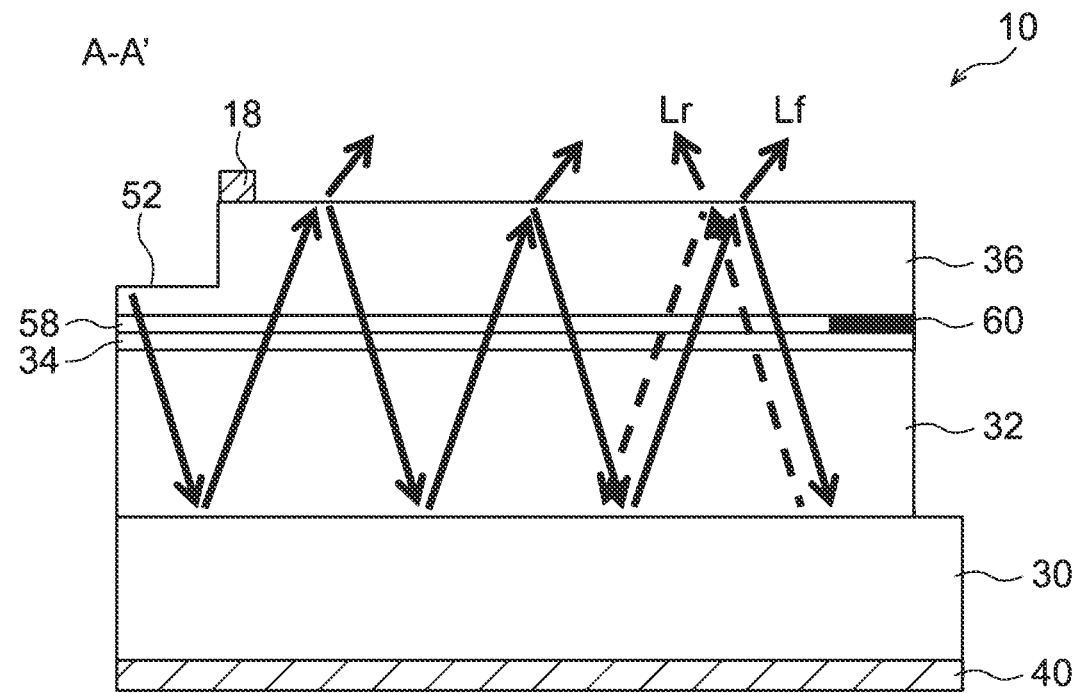
FIG. 1B is a cross-sectional view illustrating the example of the configuration of the semiconductor optical amplifier according to the first exemplary embodiment.

In the semiconductor optical amplifier 10 according to the present exemplary embodiment, the interface between the conductive region 58 and the nonconductive region 60 (hereinafter, referred to as the "oxidation front 56") extends in the propagation direction of propagation light which is introduced from the optical coupler 52 and propagates through the DBR waveguide (a direction from the left toward the right on the drawing sheet of FIGS. 1A and 1B). Further, an end surface of the oxidation front 56 on the opposite side to the optical coupler 52 is formed in a shape along the outer shape of the wide part 62, and the propagation light is reflected inside the wide part 62, thereby being attenuated (terminated). The wide part 62 according to the present exemplary embodiment is configured to include an end surface of the oxidation front 56 widened in a direction intersecting with the propagation direction of propagation light as shown in FIG. 1A as seen in a plan view (when seen from a direction perpendicular to the substrate 30). The nonconductive region 60 is formed by performing an oxidation process on the semiconductor optical amplifier in which at least the structure up to the lower part of the upper DBR has been formed in a mesa shape, from the periphery in the process of manufacturing the semiconductor optical amplifier 10. Therefore, the outer shape of the semiconductor optical amplifier 10 includes a part along the outer shape of the wide part 62. Details of the wide part 62 such as actions will be described below. In the present exemplary embodiment, the form in which the nonconductive region 60 is formed by oxidation is described. However, the nonconductive region is not limited thereto, and may be formed by ion implantation and so on.

The upper DBR 36 is a multi-layer reflector which is configured by alternately and repeatedly stacking two kinds of semiconductor layers each of which has a film thickness of $0.25\lambda/n$ and which are different in their refraction indexes. As a specific example, the upper DBR 36 is configured by alternately and repeatedly stacking p-type low-refractive-index layers using $Al_{0.90}Ga_{0.1}As$ and p-type high-refractive-index layers using $Al_{0.2}Ga_{0.8}As$.

The optical coupler 52 according to the present exemplary embodiment is a part which a light source for generating input light (seed light) for the semiconductor optical amplifier 10 is coupled with. In the present exemplary embodiment, input light is propagated from an external light source (not shown in the drawings) through an optical fiber, and the output end of the optical fiber is coupled with the optical coupler 52 functioning as the light source unit of the semiconductor optical amplifier 10, such that the input light is introduced into the DBR waveguide. As the external light source, for example, a vertical cavity surface emitting laser (VCSEL) is used. In the present exemplary embodiment, the form in which the source of the seed light is introduced from the outside is described as an example. However, the present invention is not limited thereto, and a light emitting element such as a VCSEL to function as a light source unit may be formed in a region of the semiconductor optical amplifier 10 where the optical coupler 52 is disposed, integrally with the semiconductor optical amplifier 10.

Now, the DBR waveguide according to the present exemplary embodiment will be described in more detail. The seed light introduced from the optical coupler 52 propagates in the propagation direction from the left side toward the right side of the drawing sheet. At this time, the propagation light mainly propagates via the lower DBR 32, the active region 34, the conductive region 58, and the upper DBR 36 with a predetermined distribution, as shown in FIG. 1B. Therefore, the "DBR waveguide" is configured to include those parts. Further, in the present exemplary embodiment, since the wide part 62 is formed at the end part of the conductive region 58 which is a part of the DBR waveguide, in the wide part 62, the propagation light is reflected to a direction different from the propagation direction, and is terminated so as not to return to the direction where the light came.

In other words, since the nonconductive region 60 is formed by oxidizing the conductive region 58, the nonconductive region has a refraction index lower than that of the conductive region. Therefore, the equivalent refraction index of a region of the DBR waveguide including the conductive region 58 is higher than the equivalent refraction index of the DBR waveguide including the nonconductive region 60, and the propagation light is reflected at the interface (the oxidation front 56) between the conductive region 58 and the nonconductive region 60 in the wide part 62. According to a principle to be described below, the propagation light reflected in the wide part 62 does not return to the direction where the light came (toward the optical coupler 52).

By the way, the semiconductor optical amplifier using the DBR waveguide is composed of one pair of DBRs provided on the semiconductor substrate, the active region provided between the pair of DBRs, and the resonator spacer layers. The region interposed between the DBRs functions as the optical waveguide such that the light input to the DBR waveguide slowly propagates while being multiply and obliquely reflected. At this time, if a current is applied to the active region 34 by the P electrode 18 and the N electrode 40 provided on both sides of the DBRs, the input light is amplified, and the amplified beam is output to a direction intersecting with the substrate surface and inclined forward with respect to the propagation direction of the propagation light in the DBR waveguide (obliquely forward direction) (hereinafter, referred to as "forward output Lf"). Meanwhile, output light which is output to a direction intersecting with the substrate surface and inclined backward with respect to the propagation direction of the propagation light in the DBR waveguide when the input light has been reflected from a boundary part positioned on the opposite side to the input side is referred to as "reverse output Lr".

In other words, the region of the semiconductor optical amplifier 10 having the P electrode 18 and the N electrode 40 provided thereon (the region interposed between the P electrode 18 and the N electrode 40) has both of the function of serving as the optical waveguide and the function of serving as the optical amplification part, and emits the amplified light to the direction intersecting with the surface of the substrate 30. In other words, the semiconductor optical amplifier using the DBR waveguide constitutes a surface-emitting type semiconductor optical amplifier. Meanwhile, some parts of the DBRs are removed by etching such that a light incidence part (the optical coupler 52) having a lower refraction index is formed, and external light obliquely enters the light incidence part. In this way, the light input to the amplification unit is performed by coupling. Further, the light source (a light emitting unit) is integrated in a transverse direction as a part of the semiconductor optical amplifier such that leakage light propagates to the optical amplification part.

As described above, from some semiconductor optical amplifiers using DBR waveguides like the semiconductor optical amplifier 10, output light including reverse output Lr different from forward output Lf in their emission directions in addition to the forward output Lf is output. Since it is inconvenient that the semiconductor optical amplifier 10 has two optical output directions, it is desirable to concentrate the optical output to any one direction. In this case, it is preferable to concentrate the optical output in the forward output Lf. The reason is that the reverse output Lr is likely to be interfered by the optical system for receiving the reverse output Lr and the optical system which is coupled with the optical coupler 52 due to the arrangement of them. Meanwhile, the forward output Lf is unlikely to be interfered by, for example, the optical systems since the light is emitted in such a direction that the light goes away from the light source.

However, there is a problem that when light input to the optical coupler 52 by coupling, or light input from the integrated light emitting unit propagates through the region interposed between the pair of DBRs, if return light occurs due to reflection of the boundary part (the oxidation front 56) between the input side and the output side), the operation of the semiconductor optical amplifier becomes unstable, and it becomes impossible to obtain a stable amplified optical output in the forward direction.

Figure 7A:
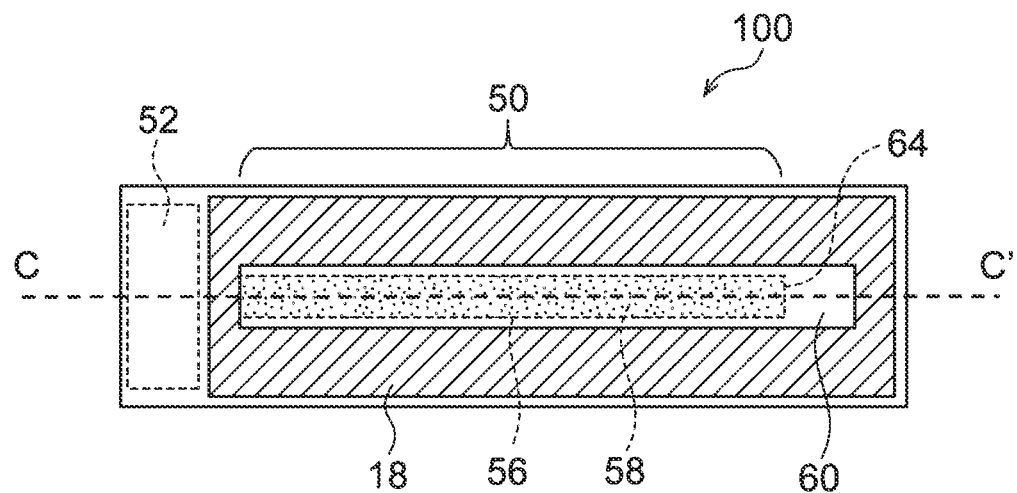
FIG. 7A is a plan view illustrating the configuration of the semiconductor optical amplifier according to the comparative example.
Figure 7B:
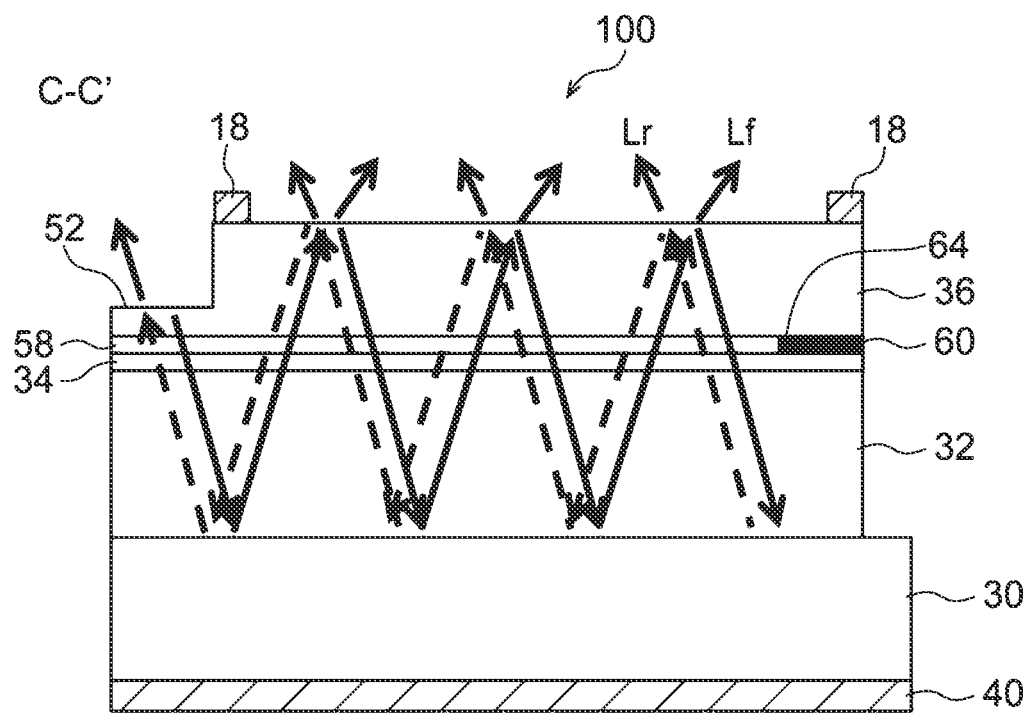
FIG. 7B is a cross-sectional view illustrating the configuration of the semiconductor optical amplifier according to the comparative example.

The above-mentioned problem will be described in more detail with reference to FIGS. 7A and 7B. FIG. 7A shows a semiconductor optical amplifier 100 according to a comparative example which includes an optical amplification part 50 and an optical coupler 52 similarly to the semiconductor optical amplifier 10 shown in FIG. 1A. FIG. 7B is a cross-sectional view taken along a line C-C' shown in FIG. 7A. In the following description, components identical to those in the semiconductor optical amplifier 10 are denoted by the same reference symbols, and a detailed description thereof will not be made.

As shown in FIG. 7A, the semiconductor optical amplifier 100 includes a conductive region 58 and a nonconductive region 60 with an oxidation front 56 as a boundary. Further, an end part 64 of the conductive region 58 on the opposite side to the optical coupler 52 is perpendicular to the propagation direction of propagation light. In other words, the end part 64 is not oblique to the propagation direction of propagation light.

In the semiconductor optical amplifier 100 having the above-described configuration, input light entering from the optical coupler 52 is amplified while propagating toward the end part 64, and is output, as forward output Lf, to the direction inclined forward with respect to the propagation direction. Meanwhile, propagation light reflected from the end part 64 returns toward the optical coupler 52 as return light, and is output, as reverse output Lr, to the direction inclined backward with respect to the propagation direction. In the case of the semiconductor optical amplifier 100, the reverse output Lr is output from the whole of the DBR waveguide as shown in FIG. 7B. Therefore, in the semiconductor optical amplifier 100 according to the comparative example, since the propagation light and the return light coexist, and light energy is distributed to the reverse output Lr, the forward output Lf decreases. This is the mechanism of occurrence of the above-mentioned problem.

Because of the above-mentioned problem, in the present exemplary embodiment, the wide part for reflecting light propagating through the DBR waveguide in the semiconductor optical amplifier to a direction intersecting with the propagation direction, thereby attenuating (terminating) the light is provided at the end part of the DBR waveguide. Therefore, the return light is attenuated in the course of propagation, and interference between the propagation light and the return light is suppressed. Therefore, as compared to the case where a surface-emitting type semiconductor optical amplifier does not include such a wide part, distribution of light energy to the reverse output Lr decreases, and light energy which is turned to the forward output Lf increases. Therefore, a semiconductor optical amplifier whose optical output (the forward output Lf) in a predetermined direction is larger is provided.

In other words, as shown in FIG. 1A, the wide part 62 is formed by widening the opposite side of the conductive region 58, extending the propagation direction, to the optical coupler 52. In other words, as seen from a direction perpendicular to the surface of the substrate 30, the conductive region of the semiconductor optical amplifier 10 includes a first region 68 of the conductive region 58 extending from the optical coupler 52 and having a predetermined width, and a second region 70 of the conductive region 58 connected to the first region 68 and widened in a direction intersecting with the propagation direction of propagation light. Further, an end surface of the oxidation front 56 located in the wide part 62, i.e. a part corresponding to the inner periphery of the second region 70 as seen from a direction perpendicular to the surface of the substrate 30 serves as a reflective surface.

Here, as shown in FIG. 1A, the wide part 62 according to the present exemplary embodiment includes a tapered part T. In other words, the width of the second region 70 of the wide part 62 in the direction perpendicular to the propagation direction changes from the width of the first region 68 in a tapered shape (smoothly). Since the width changes in the tapered shape, for example, as compared to the case where the width changes stepwise, it is more difficult for return light to return from the second region 70 to the first region 68. It may be considered that the reason is that as compared to the case where the width changes stepwise, change in the equivalent refraction index of the DBR waveguide is slower. Meanwhile, since the width changes in the tapered shape, as compared to the case where the width changes stepwise, a structure on which it is more difficult for stress to be concentrated is obtained. Therefore, there is an effect that the structure is unlikely to sustain damage such as a crack. Also, as described above, the outer shape of the semiconductor optical amplifier 10 (the outer shape of the chip) includes a part along the second region 70. In other words, the outer shape of the semiconductor optical amplifier 10 also includes a part widened from the width of the optical amplification part 50.

Figure 2:
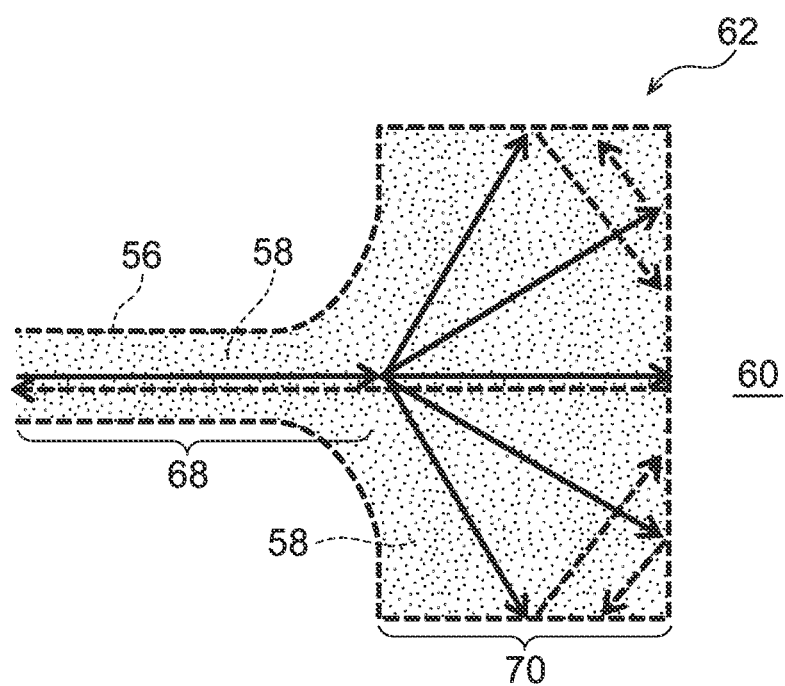
FIG. 2 is a view for explaining reflection in a wide part of the semiconductor optical amplifier according to the first exemplary embodiment.
Figure 2:
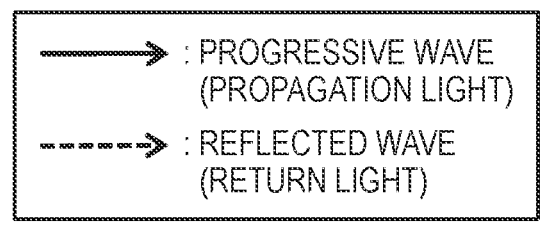

Now, the wide part 62 will be described in more detail with reference to FIG. 2 to FIG. 4B. First, with reference to FIG. 2, an action of the wide part 62 will be described. FIG. 2 is an enlarged view of a part of the wide part 62 shown in FIG. 1A. The propagation light has a property of spreading according to the width of the conductive region 58. Therefore, if the conductive region 58 is widened at the boundary between the first region 68 and the second region 70 (hereinafter, referred to as the "connection part") as shown in FIG. 2, the propagation light spreads at the connection part. In other words, the propagation light having propagated from the direction of the optical coupler 52 is expanded (spreads) by diffraction of the connection part as shown in FIG. 2. The expanded propagation light is thereafter reflected from the oxidation front 56 of the wide part 62, and is mostly attenuated in the second region of the wide part 62. Therefore, it becomes possible to effectively reduce return light, and the forward output Lf is stably increased.

Figure 3A:
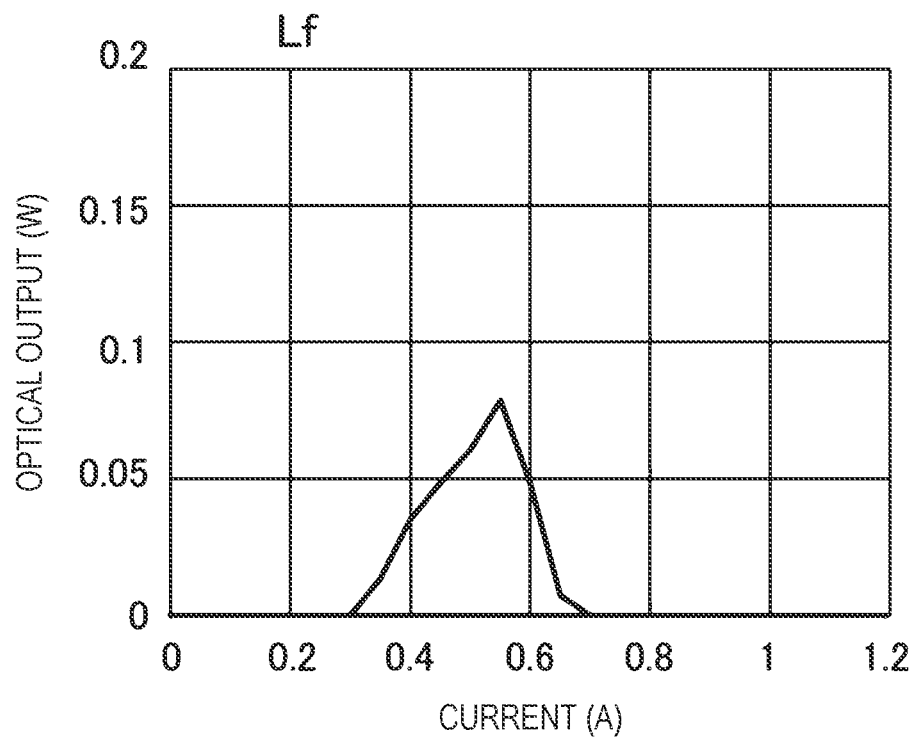
FIG. 3A is a graph illustrating an optical output characteristic of the semiconductor optical amplifier according to the first exemplary embodiment.
Figure 3B:
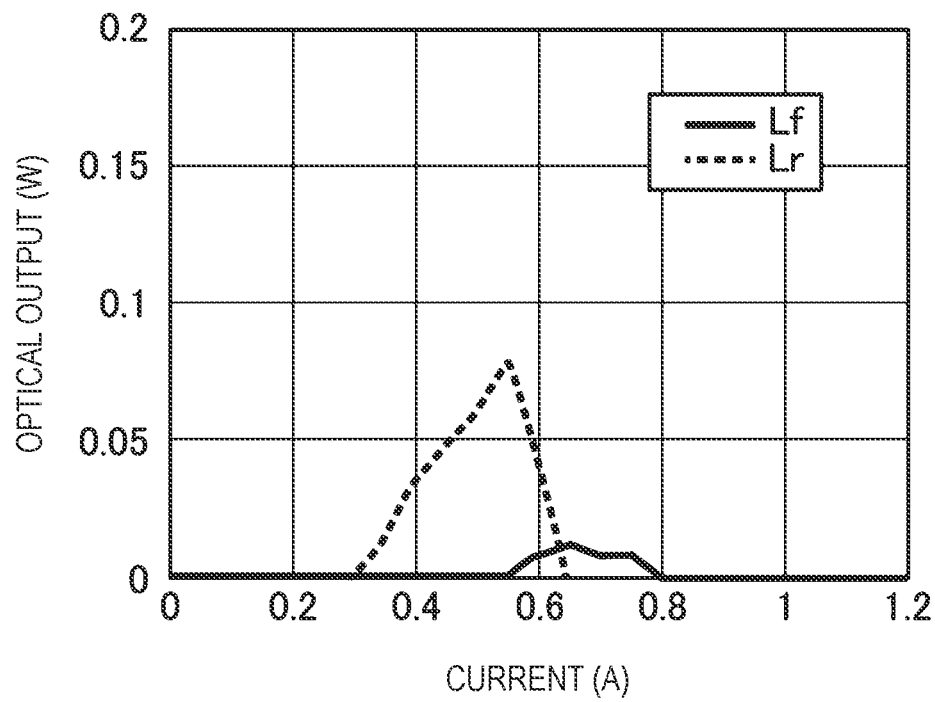
FIG. 3B is a graph illustrating an optical output characteristic of a semiconductor optical amplifier according to a comparative example.

FIG. 3A shows the optical output characteristic of the semiconductor optical amplifier 10. FIG. 3B shows the optical output characteristic of the semiconductor optical amplifier 100 according to the comparative example, for comparison. As shown in FIG. 3B, in the semiconductor optical amplifier 100, the reverse output Lr is predominant over the forward output Lf; whereas as shown in FIG. 3A, most of the optical output of the semiconductor optical amplifier 10 is forward output Lf, and reverse output Lr is rarely observed.

Figure 4A:
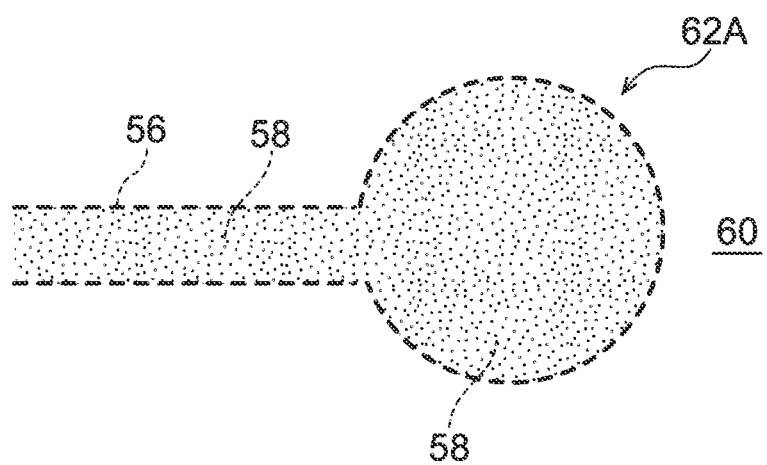
FIG. 4A and FIG. 4B are views illustrating variations of the wide part of the semiconductor optical amplifier according to the first exemplary embodiment.
Figure 4B:
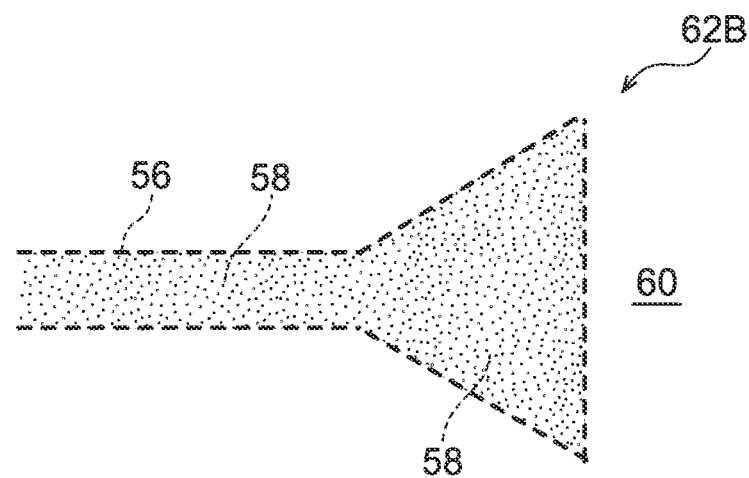

Meanwhile, FIGS. 4A and 4B show variations of the wide part 62. In the present exemplary embodiment, as shown in FIG. 2, the wide part 62 having an almost rectangular shape as seen in a plan view (as seen from a direction perpendicular to the substrate 30) has been described as an example. However, the present invention is not limited thereto. For example, a wide part 62A having an almost circular shape as seen in a plan view as shown in FIG. 4A may be configured. Also, in the present exemplary embodiment, the form in which the width of the wide part 62 as seen in a plan view increases in the tapered shape from the first region 68 to the second region 70 has been described as an example. However, the present invention is not limited thereto. For example, as shown in FIG. 4B, a wide part 62B having an almost triangular shape whose width as seen in a plan view changes linearly from the connection part may be configured.

Second Exemplary Embodiment

Figure 5A:
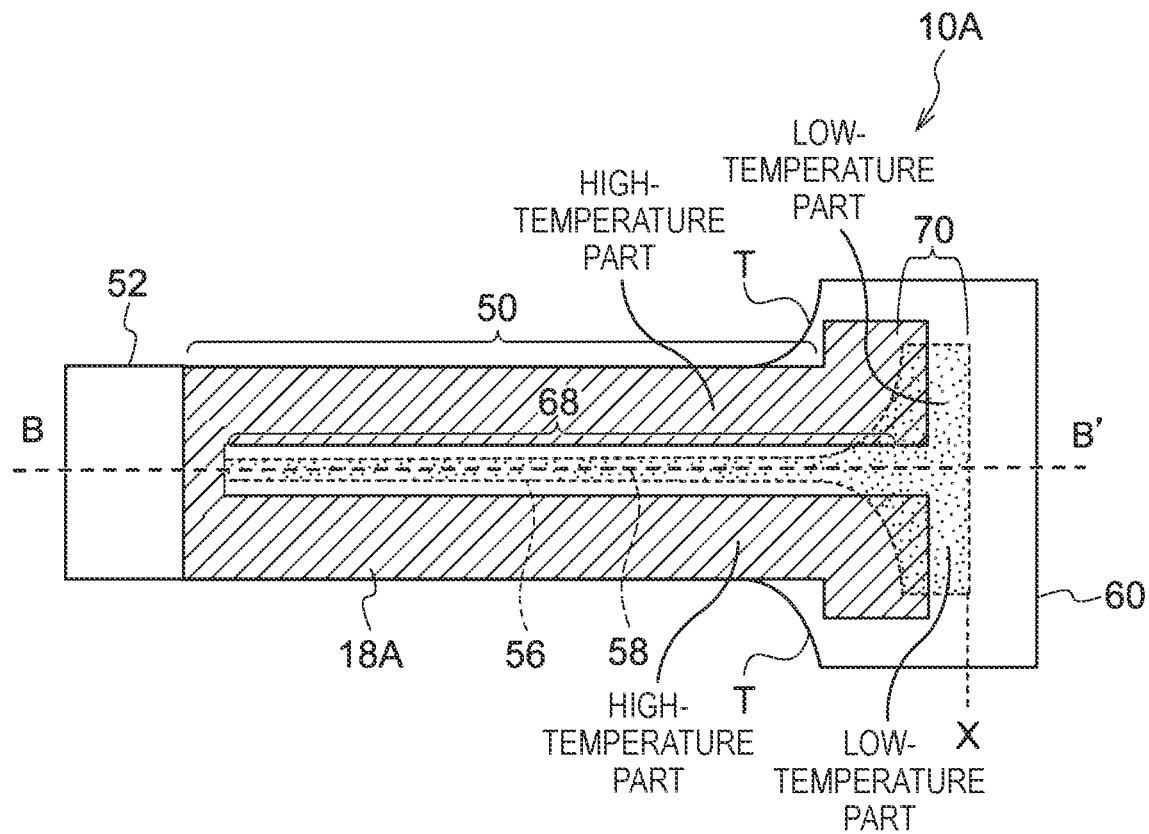
FIG. 5A is a plan view illustrating an example of the configuration of a semiconductor optical amplifier according to a second exemplary embodiment.
Figure 5B:
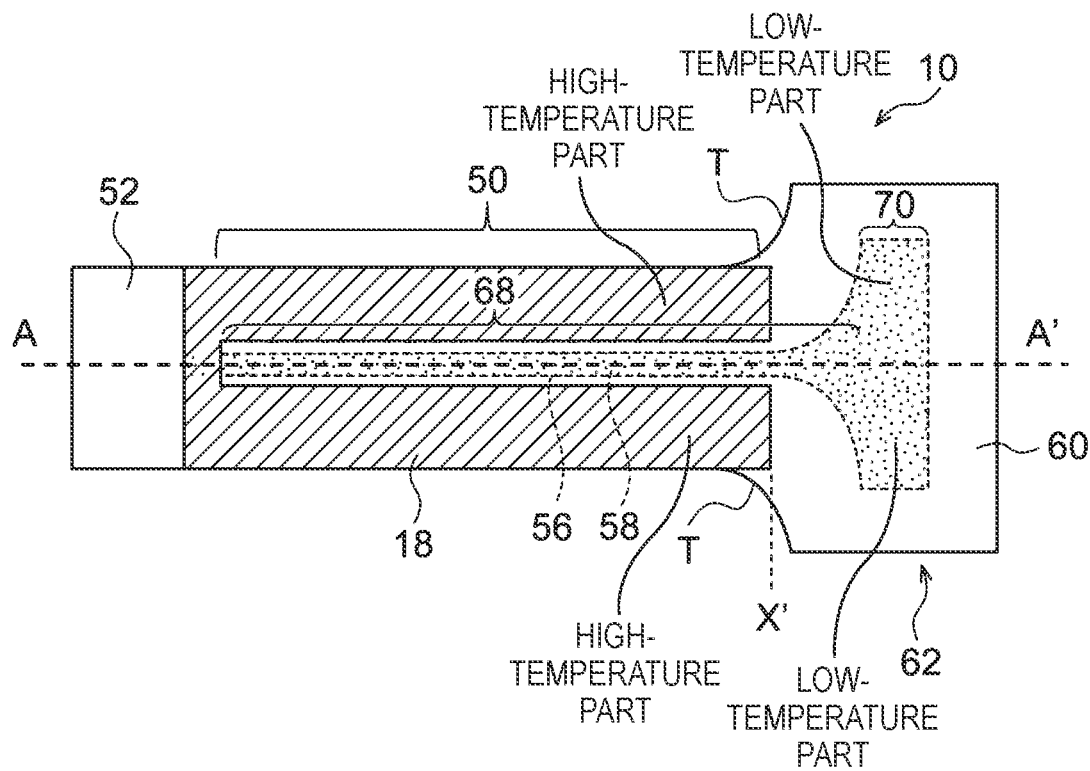
FIG. 5B is a plan view illustrating an example of the configuration of the semiconductor optical amplifier according to the first exemplary embodiment.

With reference to FIGS. 5A and 5B, a semiconductor optical amplifier 10A according to a second exemplary embodiment will be described. The semiconductor optical amplifier 10A has the same form as that of the semiconductor optical amplifier 10 according to the above-described exemplary embodiment except that it has a P electrode 18A in place of the P electrode 18. Therefore, components identical to those in the semiconductor optical amplifier 10 are denoted by the same reference symbols, and a detailed description thereof will not be made.

First of all, a phenomenon related to reflection of propagation light in the semiconductor optical amplifier 10 will be described with reference to FIG. 5B. In other words, in the semiconductor optical amplifier 10, a driving current may cause reflection of propagation light in the vicinity of an end part of the P electrode 18. In other words, as described above, when the semiconductor optical amplifier 10 is operated, the power supply is connected between the P electrode 18 and the N electrode 40, whereby a driving current flows. Then, self-heating attributable to the current application causes a temperature difference between both sides of a boundary X' positioned at an end part of the P electrode 18. In other words, with reference to the boundary X', one side where the P electrode 18 exist forms a high-temperature part, and the other side where the P electrode 18 does not exist forms a low-temperature part. In general, the refraction indexes of semiconductors depend on temperature. Therefore, if the temperature difference occurs, a refraction index distribution is generated. By a so-called thermal lens effect attributable to the refraction index distribution, a phenomenon in which the propagation light is reflected and returns to a direction opposite to the propagation route may occur. Since the return light occurs before the wide part 62, some of the propagation light cannot enter the second region 70, and the return light increases. As a result, the reverse output Lr increases.

For this reason, in the semiconductor optical amplifier 10A according to the present exemplary embodiment, in place of the P electrode 18 of the semiconductor optical amplifier 10, the P electrode 18A extending to the inside of the wide part 62 is used. Therefore, instead of the boundary X', a boundary X is formed, and the boundary between a low-temperature part and a high-temperature part is formed inside the wide part 62. Therefore, even if reflection of propagation light is caused by the thermal lens effect, the reflected wave attributable to the reflection behaves similarly to a reflected wave in the second region as shown in FIG. 2. Therefore, the reflected wave is restrained from propagating reversely through the first region 68. As a result, for example, even if the thermal lens effect is caused by the driving current, the return light is suppressed, and a decrease in the forward output Lf is suppressed.

As described above, according to the semiconductor optical amplifier 10A of the present exemplary embodiment, it becomes possible to further improve the effect of the wide part 62, and it is possible to further increase the forward output Lf. However, the position of the end part of the P electrode 18A on the boundary (X) side is not particularly limited, and it is desirable that the end part should be positioned above the second region 70 as seen in a plan view in consideration of the above-mentioned phenomenon. Also, the shape of the electrode 18A also is not particularly limited. In the example of FIG. 5A, the form in which the P electrode 18A is curved in an L shape (widens) (the width increases) on the boundary (X) side has been described as an example. However, the present invention is not limited thereto. The P electrode 18A may be configured such that the width is constant.

Third Exemplary Embodiment

Figure 6A:
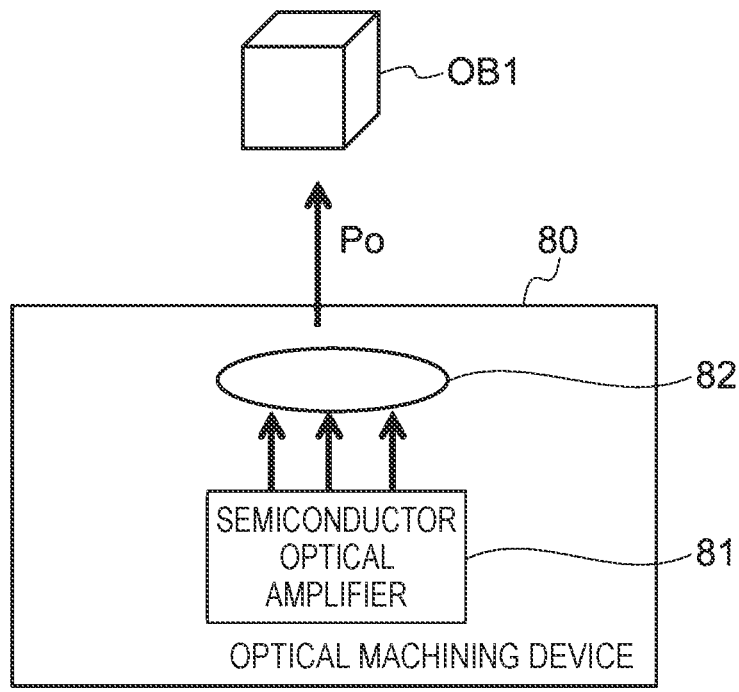
FIG. 6A is a block diagram illustrating an example of an optical machining device according to a third exemplary embodiment.

Now, an optical output device and a distance measuring device according to a third exemplary embodiment will be described with reference to FIGS. 6A and 6B. FIG. 6A shows a block diagram of an optical machining device 80 as an example of the optical output device according to the present exemplary embodiment, and FIG. 6B shows a block diagram of a distance measuring device 90.

As shown in FIG. 6A, the optical machining device 80 includes a semiconductor optical amplifier 81 and a condensing lens 82. The semiconductor optical amplifier 81 is, for example, the semiconductor optical amplifier 10 (or the semiconductor optical amplifier 10A) according to an exemplary embodiment described above. As shown in FIG. 6A, light emitted from the semiconductor optical amplifier 81 is condensed by the lens 82, and is radiated as output light Po onto an object OB1 to be machined, whereby machining on the object OB1 is performed.

Figure 6B:
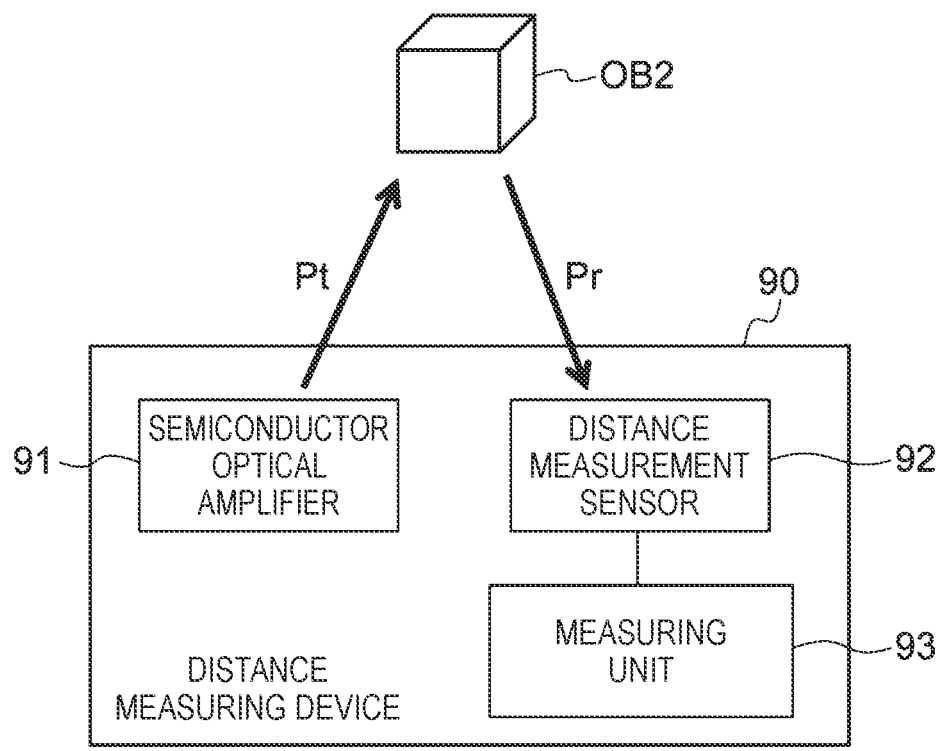
FIG. 6B is a block diagram illustrating an example of a distance measuring device according to the third exemplary embodiment.

Meanwhile, as shown in FIG. 6B, the distance measuring device 90 includes a semiconductor optical amplifier 91, a distance measurement sensor 92, and a measuring unit 93. The semiconductor optical amplifier 91 is, for example, the semiconductor optical amplifier 10 (or the semiconductor optical amplifier 10A) according to an exemplary embodiment described above. Also, the distance measurement sensor 92 is configured with, for example, a photosensitive element such as a photodiode, and the measuring unit 93 is configured mainly with semiconductor devices such as a CPU, an ASIC, etc.

In the distance measuring device 90, projection light Pt emitted from the semiconductor optical amplifier 91 is radiated onto an object OB2 to be measured (for example, a person or an object), and the reflected light from the object OB2 is input as reception light Pr to the distance measurement sensor 92. The reception light Pr input to the distance measurement sensor 92 is converted into an electric signal, and on the basis of the electric signal, predetermined arithmetic processing is performed in the measuring unit 93, whereby the distance between the object OB2 and, for example, the distance measuring device 90 is measured.

The foregoing description of the embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A semiconductor optical amplifier comprising:
   a substrate having a substrate surface;
   a light source disposed on the substrate; and
   an optical amplifier that amplifies light propagating in a predetermined direction from the light source and emits, from a light emitting surface parallel to the substrate surface, the amplified light in an emission direction intersecting with the substrate surface, the optical amplifier including:
   a conductive region extending in the predetermined direction along the substrate surface from the light source, the conductive region including:
   a first region extending from the light source in the predetermined direction and having a predetermined width as seen from a direction perpendicular to the substrate surface; and
   a second region connected to the first region and having a width widened relative to the predetermined width of the first region, the second region being configured to expand the light in a direction intersecting with the predetermined direction, the second region having an interior in which the light is reflected; and
   a nonconductive region disposed around the conductive region,
   wherein the predetermined direction and the direction intersecting the predetermined direction both intersect the emission direction in which the light is emitted from the light emitting surface.

2. The semiconductor optical amplifier according to claim 1, wherein
   the width of the second region varies, in a tapered shape, from the predetermined width of the first region.

3. The semiconductor optical amplifier according to claim 2, wherein
   the second region has a rectangular shape as seen from the direction perpendicular to the substrate surface.

4. The semiconductor optical amplifier according to claim 1, further comprising:

a first semiconductor multi-layer reflector of a first conductivity type disposed on the substrate;

an active region disposed on the first semiconductor multi-layer reflector; and a second semiconductor multi-layer reflector of a second conductivity type disposed on the active region, wherein the nonconductive region is an oxidized region or an ion-implanted region disposed at a part of at least one of the first semiconductor multi-layer reflector and the second semiconductor multi-layer reflector.

5. The semiconductor optical amplifier according to claim 2, further comprising:

a first semiconductor multi-layer reflector of a first conductivity type disposed on the substrate;

an active region disposed on the first semiconductor multi-layer reflector; and a second semiconductor multi-layer reflector of a second conductivity type disposed on the active region, wherein the nonconductive region is an oxidized region or an ion-implanted region disposed at a part of at least one of the first semiconductor multi-layer reflector and the second semiconductor multi-layer reflector.

6. The semiconductor optical amplifier according to claim 3, further comprising:

a first semiconductor multi-layer reflector of a first conductivity type disposed on the substrate;

an active region disposed on the first semiconductor multi-layer reflector; and a second semiconductor multi-layer reflector of a second conductivity type disposed on the active region, wherein the nonconductive region is an oxidized region or an ion-implanted region disposed at a part of at least one of the first semiconductor multi-layer reflector and the second semiconductor multi-layer reflector.

7. The semiconductor optical amplifier according to claim 4, wherein the semiconductor optical amplifier has a mesa structure extending to at least a lower part of the second semiconductor multi-layer reflector, and the semiconductor optical amplifier has a profile at least partly along the second region.

8. The semiconductor optical amplifier according to claim 5, wherein the semiconductor optical amplifier has a mesa structure extending to at least a lower part of the second semiconductor multi-layer reflector, and the semiconductor optical amplifier has a profile at least partly along the second region.

9. The semiconductor optical amplifier according to claim 6, wherein the semiconductor optical amplifier has a mesa structure extending to at least a lower part of the second semiconductor multi-layer reflector, and the semiconductor optical amplifier has a profile at least partly along the second region.

10. The semiconductor optical amplifier according to claim 1, further comprising:

an electrode disposed above the nonconductive region, at least partly along the conductive region.

11. The semiconductor optical amplifier according to claim 10, wherein the electrode covers at least a part of the second region.

12. An optical output device comprising:

the semiconductor optical amplifier according to claim 1; and a light condenser that condenses light emitted from the semiconductor optical amplifier.

13. A distance measuring device comprising:

the semiconductor optical amplifier according to claim 1;

a photo sensor that receives reflected light emitted from the semiconductor optical amplifier and reflected from an object to be measured; and a sensor that measures distance to the object based on the reflected light received by the photo sensor.

* * * * *